United States Patent [19]

Hillenius et al.

[11] Patent Number: 4,935,376
[45] Date of Patent: Jun. 19, 1990

[54] MAKING SILICIDE GATE LEVEL RUNNERS

[75] Inventors: Steven J. Hillenius, Summit, N.J.; Kuo-Hua Lee, Lower Macungie Township, Lehigh County, Pa.; Chih-Yuan Lu, Lower Macungie Township, Lehigh County, Pa.; Janmye Sung, Lower Macungie Township, Lehigh County, Pa.

[73] Assignee: AT&T Bell Laboratories, Murray Hill, N.Y.

[21] Appl. No.: 420,207

[22] Filed: Oct. 12, 1989

[51] Int. Cl.⁵ .............................................. H01L 29/46
[52] U.S. Cl. .................................... 437/41; 437/192; 437/193; 437/189; 437/200; 437/57
[58] Field of Search ............... 437/192, 193, 189, 200, 437/57

[56] References Cited

U.S. PATENT DOCUMENTS

| | | | |
|---|---|---|---|
| 4,374,700 | 2/1983 | Scott et al. | 437/192 |
| 4,382,827 | 5/1983 | Romado-Moran et al. | 437/56 |
| 4,392,150 | 7/1983 | Courreges | 437/192 |
| 4,442,591 | 4/1984 | Haken | 437/56 |
| 4,455,737 | 6/1984 | Godejahn, Jr. | 437/193 |
| 4,619,038 | 10/1986 | Pintchovski | 437/200 |
| 4,628,590 | 12/1986 | Udo et al. | 437/192 |
| 4,734,383 | 3/1988 | Ikeda et al. | 437/57 |

FOREIGN PATENT DOCUMENTS

| | | | |
|---|---|---|---|
| 125651 | 9/1980 | Japan | 437/193 |
| 208169 | 12/1982 | Japan | 437/200 |
| 052850 | 3/1983 | Japan | 437/193 |
| 130554 | 8/1983 | Japan | 437/193 |
| 133551 | 7/1988 | Japan | 437/200 |

Primary Examiner—Brian E. Hearn
Assistant Examiner—Trung Dang
Attorney, Agent, or Firm—Richard D. Laumann

[57] ABSTRACT

Integrated circuits are fabricated with thick self-aligned silicide runners on the field oxide by etching back the first dielectric to expose patterned polysilicon on the field oxide and then forming a silicide on the patterned polysilicon.

7 Claims, 1 Drawing Sheet

MAKING SILICIDE GATE LEVEL RUNNERS

TECHNICAL FIELD

This invention relates to integrated circuits using silicide interconnections between components.

BACKGROUND OF THE INVENTION

Integrated circuits require low resistance electricals contacts to conmponents, as well as low resistance interconnects or runners between components. Although polysilicon has a relatively low resistivity and has been widely and successfully used for both applications, alternative materials have been sought in an attempt to obtain even lower resistivites. As the dimensions of components continue to decrease, such lower resistivity alternatives become even more desirable because the resistance of the interconnect is inversely proportional to its cross-sectional area. At the present time, the most commonly used alternative to polysilicon is a transition metal silicide. Several techniques have been developed for fabricating such silicides. In one exemplary technique, fabrication of a silicide proceeds by depositing the transition metal, such as Ti or Co, on silicon and heating the resulting composite. The transitional metal reacts with the silicon to form the silicide. In one common embodiment of this technique, the silicon is present only where the silicide is ultimately desired and there is no need to remove unwanted silicide, although the unreacted metal must be removed by e.g., etching. The resulting silicide is self-aligned and is frequently referred to by those skilled in the art as salicide (self-aligned silicide). Salicides are used on gate electrodes, source/drain region electrical contacts, and interconnectss. Another exemplary technique fabricates structures that are called polycides. Polysilicon and transistion metal silicide layers are sequentially deposited and then simultaneously patterned. Both the gate and gate runner have a silicide on top. However, the gate etching may be difficult to control due to the silicide/polysilicon structure.

The chemical reaction between silicon and the metal necessarily consumes some of the underlying silicon; i.e., the underlying silicon reacts with the metal to form the silicide. However, deposition of a thick metal layer, necessary to obtain a thick, low-resistance, silicide layer, is frequently undesirable on both the gate and the source/drain regions. A thick silicide layer in the gate may produce either a high stress which adversely affects the quality of both the gate oxide and the device characteristics, or some silicide which penetrates the gate oxide and also adversely affect the device characteristics. The likelihood of the latter problem becomes greater as gate oxides continue to become thinner. Silicides are desirable on the source/drain regions because they have low resistance as compared to other materials. However, the source/drain regions should be shallow in integrated circuit devices having submicron features, and a thick metal deposition on these regions might lead to a reaction that would consume all, or a substantial fraction, of these regions.

Use of silicide containing structure for both the source/drain regions and the runners is theroretically possible, but is difficult to implement in practice because of the conflicting requirements of a thick silicide on the runners and a thin silicide on the source and drain regions. Generally, there exist similar considerations to the use of materials other than polysilicon and silicides in the gate and for interconnects.

SUMMARY OF THE INVENTION

Our method fabricates integrated circuits by depositing a layer of a conducting gate material on a substrate which includes field oxide regions and device regions comprising a gate structure, pattern the conducting gate material on the field oxide; forming a first dielectrical layer over the substrate which covers the gate material; etching back the dielectric until top surfaces of the conducting gate material are exposed on the field oxide regions but not on the device regions; and increasing conductivity of the exposed conducting gate material. In one preferred embodiment, the conducting gate material is polysilicon and the conductivity is increased by forming a silicide on the patterned polysilicon which forms gate runners. Although the gate structure is not salicided, low resistance gate level runners on the field oxide are obtained. In yet another preferred embodiment, the top of the gate structure is dielectric and salicide source and drain regions are formed in another salicidation process.

DETAILED DESCRIPTION

Figure 1:
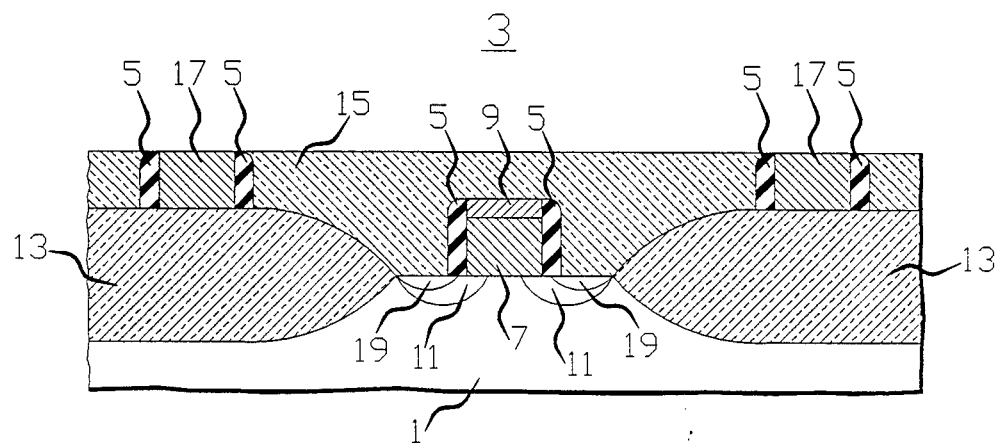
FIGS. 1 and 2 are sectional views of structures useful in explaining the method of this invention. For reasons of clarity, the elements depicted are not drawn to scale.

The method of this invention will first be described by reference to a particular embodiment. Several modifications of this embodiment will also be described, and still others will be evident to those skilled in the art. FIG. 1 is a sectional view of a portion of an integrated circuit, i.e., a field-effect transistor, at an intermediate stage of fabrication according to this invention. Depicted are substrate 1; gate structure 3, which has insulating sidewalls 5, polysilicon conductor 7, and, optionally, dielectric layer 9 on top of the polysilicon; source/drain regions 11, field oxide 13, second dielectric layer 15; and polysilicon runners 17 on the field oxide. The area between the field regions, which contains the gate structure and the source/drain regions, is termed a device region. Silicide layers 19 contact the source/drain regions 11. The runners also have insulating sidewalls 5. An integrated circuit will have many transistors; only a portion of a single transistor is depicted for clarity of exposition.

The elements depicted are fabricated using well-known techniques which need not be described in detail, as the techniques are known to those skilled in the art. Some device elements, such as the gate oxide, are not depicted as they are not essential to the description of device fabrication. Several features of an exemplary fabrication sequence will, however, be briefly noted. The polysilicon is blanket deposited and lithographically patterned to form the runners 17 and gate structure 7. An oxidation step, or oxide deposition followed by antisotropic etching, produces the sidewall spacers 5. If desired, a salicidation step can be performed to fabricate the thin salicide regions. If the gate structure does not have a dielectric on top of the polysilicon, a salicide may be formed on top of the gate structure. A first dielectric layer 15, which covers the patterned polysilicon, is then deposited and deposition of a planarization photoresist follows. An etchback planarizes the first dielectric and leaves the top surfaces of the polysilicon runners 17 exposed. If a dieletric is initially present on top of the runners, it is removed by the planarization etch, as shown in FIG. 1. Etching is stopped as soon as the surfaces of the runners are cleared of dielectric material so that the device elements; i.e., source/drain regions and gate structure, are not exposed. Some overetching is desirable to ensure that the top surfaces of all runners are clear.

A silicide-forming transition metal, such as Ti or Co, is now blanket deposited and the structrue heated to form a silicide on the exposed portions of the runners, which are, as previously mentioned, primarily the top surface of the runner. The thickness of the deposited metal is determined by the desired thickness of the silicide. Unreacted metal is removed and another, i.e., second, dielectric layer is deposited to the final desired thickness. The second dielectric layer is then patterned to form windows fo the electrical contacts to the device elements; i.e., source, drain, and gate.

Figure 2:
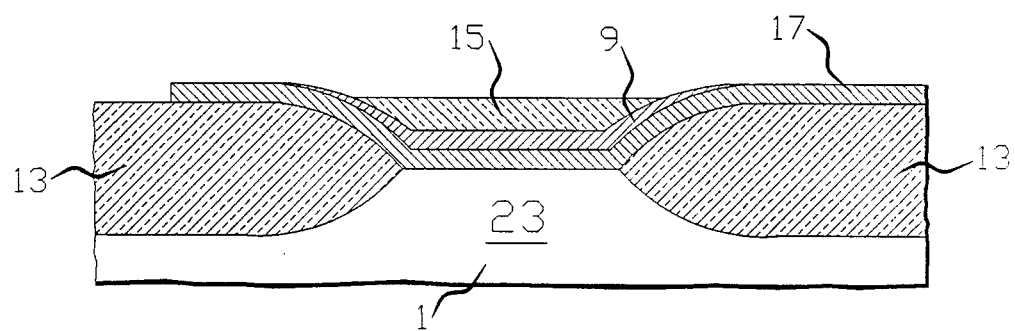

The presence of a dielectric on top of the gate electrode structure is not essential to prevent overetching of the gate structure, will be further evident from consideration of FIG. 2, which is a sectional view at right angles to that of FIG. 1. Depicted are substrate 1, layer 9, field oxide regions 13, dielectric layer 15, patterned polysilicon layer 17; and device region 23, which is between the field oxide regions. Within device region 23 are the gate and source/drain regions; these elements are not depicted for reasons of clarity. The fabrication technique is that described with respect to FIG. 1. The dielectric layer 15 is generally thicker in the device region 23 than it is on the field oxide region 13 due to the presence of the field oxide. Accordingly, the planarizing etchback clears patterned polysilicon 17 on the field oxide regions but will not affect any of the device elements, including the gate, which are masked by dielectric 15. Layer 9 may be, e.g., a salicide or a dielectric.

Other variations are contemplated. The source/drain regions need not be salicide regions 19, as the salicidation step for these regions may be omitted, if desired. If they are salicide regions, the dielectric on top of the gate structure is omitted if gate salicidation desired. The salicide so formed will be thin. The presence of the dielectric on the gate structure prevents silicide formation on the polysilicon if gate salicidation is undesired.

The described process leads to thin slices for the source/drain regions and a thick silicide for the runners. Additionally, it will be readily appreciated that the second dielectric layer will have an essentially planar surface which may be used for patterned metallizations.

Embodiments other than those mentioned, as well as modifications of the described embodiments, will be readily thought of those by skilled in the art. For example, the conducting gate material might comprise a conducting nitride, such as TiN. Additionally, the conductivity of the exposed conductiong gate material, i.e., runner, might be increased by selective deposition of a metal such as tungsten.

I claim:

1. A method of fabricating integrated circuits comprising the steps of: depositing a layer of a conducting gate material on a substrate which includes field oxide regions and device regions comprising a gate structure;
    patterning said conducting gate material on said field oxide regions;
    forming a first dielectric over said substrate which covers gate material;
    etching back said dielectric to expose the top surfaces of said conducting gate material on said field oxide regions but not said device regions; and
    increasing the conductivity of said exposed conducting gate material.

2. A method as recited in claim 1 in which said conducting gate material comprises polysilicon.

3. A method as recited in claim 2 in which said increasing step comprises the steps of:
    depositing a silicide forming transition metal; and,
    heating to form a silicide.

4. A method as recited in claim 1 comprising the further step of depositing and patterning a second dielectric to form windows which expose seclected portions of said device regions.

5. A method as recited in claim 4 comprising the further step of depositing a metal in said windows.

6. A method as recited in claim 1 which said increasing step comprises depositing tungsten selectively on said exposed conducting gate material.

7. A method as recited in claim 2 comprising the further step of salicidizing said source and drain regions.

* * * * *